United States Patent
Sun

(10) Patent No.: US 8,762,818 B1
(45) Date of Patent: Jun. 24, 2014

(54) SYSTEM AND METHODS FOR PERFORMING DECODING ERROR DETECTION IN A STORAGE DEVICE

(75) Inventor: Fei Sun, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 722 days.

(21) Appl. No.: 12/713,520

(22) Filed: Feb. 26, 2010

Related U.S. Application Data

(60) Provisional application No. 61/157,593, filed on Mar. 5, 2009.

(51) Int. Cl.
*H03M 13/00* (2006.01)

(52) U.S. Cl.
USPC .......................................... 714/781; 714/805

(58) Field of Classification Search
USPC .................................. 714/703, 803
See application file for complete search history.

(56) References Cited

U.S. PATENT DOCUMENTS

| | | | | |
|---|---|---|---|---|
| 3,629,855 A * | 12/1971 | Conley | ........................ | 714/47.1 |
| 4,584,686 A * | 4/1986 | Fritze | ........................ | 714/784 |
| 5,027,357 A * | 6/1991 | Yu et al. | ........................ | 714/758 |
| 5,467,297 A * | 11/1995 | Zook | ........................ | 708/492 |
| 5,974,580 A * | 10/1999 | Zook et al. | ........................ | 714/755 |
| 5,978,958 A * | 11/1999 | Tanaka et al. | ........................ | 714/804 |
| 6,493,844 B1 * | 12/2002 | Kanasugi et al. | ........................ | 714/781 |
| 6,651,214 B1 * | 11/2003 | Weng et al. | ........................ | 714/771 |
| 6,772,386 B2 * | 8/2004 | Iwata et al. | ........................ | 714/755 |
| 6,820,232 B2 * | 11/2004 | Kim et al. | ........................ | 714/781 |
| 2004/0177314 A1 * | 9/2004 | Kleihorst et al. | ........................ | 714/801 |

OTHER PUBLICATIONS

Wicker, Stephen B. "Error Control Systems for Digital Communication and Storage". Upper Saddle River: Prentice Hall, 1995.*

* cited by examiner

*Primary Examiner* — Steve Nguyen

(57) ABSTRACT

System and methods for performing decoding error detection in a storage device are provided. Data bits of a data polynomial may be retrieved from a storage device. The data bits may be arranged in a first order. Error correction may be performed on the retrieved data bits of the data polynomial to produce an error polynomial based on error correction parity information encoded in the data polynomial. Bits of the error polynomial are arranged in a second order that is reverse to the first order. A first remainder of the error polynomial may be computed based on data bits corresponding to the data polynomial arranged in the second order. An error in the error polynomial may be detected based on the computed first remainder.

20 Claims, 7 Drawing Sheets

SYSTEM AND METHODS FOR PERFORMING DECODING ERROR DETECTION IN A STORAGE DEVICE

CROSS-REFERENCE TO RELATED APPLICATION

This application claims the benefit under 35U.S.C. §119(e) of U.S. Provisional Application No. 61/157,593, filed Mar. 5, 2009 which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Typically, magnetic recording channel systems employ error correction codes (ECC) (e.g., 12-bit Reed Solomon (RS) code) to remove residual errors made by the channel detector. Error detection codes (EDC) are used to detect decoding failure produced by the ECC. After data encoded by the ECC and EDC is read from a storage medium, the data is decoded using an ECC decoder. The ECC decoder produces an error polynomial which is checked by EDC circuitry to detect failure in the error correction. However, the error polynomial produced by the ECC decoder is in reverse order from normal order in which the data is read from the storage medium. Moreover, because the EDC circuitry typically operates on the data in this normal order, traditional systems lack efficient techniques for processing the error polynomial produced by the ECC decoder.

SUMMARY

In view of the foregoing, systems and methods for performing decoding error detection in a storage device in accordance with various embodiments of the present disclosure are provided.

In some embodiments, data bits of a data polynomial may be retrieved from a storage device. The data bits as retrieved may be arranged in a first order (e.g., high order symbol $r_n(x)$ comes before lower order symbol $r_{n-1}(x)$). Error correction may be performed on the retrieved data bits of the data polynomial to produce an error polynomial based on error correction parity information encoded in the data polynomial. Bits of the produced error polynomial are arranged in a second order that is reverse to the first order (e.g., lower order symbol $r_{n-1}(x)$ comes before higher order symbol $r_n(x)$). A first remainder of the error polynomial may be computed to detect an error in the error polynomial based on data bits corresponding to the data polynomial arranged in the second order.

In some embodiments, the data polynomial may be generated based on an error detection polynomial. The first remainder may be computed based on the error detection polynomial. In particular, a reference polynomial may be generated based on the error detection polynomial. The reference polynomial may be multiplied and accumulated with the error polynomial to provide the first remainder. In some embodiments, the first remainder may be computed a modulus operation of the error polynomial with the error detection polynomial.

In some embodiments, a second remainder of the data polynomial may be computed based data bits of the data polynomial arranged in the first order. The first remainder may be compared with the second remainder to detect an error in the retrieved data bits of the data polynomial. In some embodiments, error correction parity information may be periodically positioned within the data polynomial.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which.

DETAILED DESCRIPTION

The present disclosure generally relates to decoding error detection in storage devices. For illustrative purposes, the present disclosure will be described in the realm of a data polynomial signal that is read back from a head-media drive (e.g., magnetic storage device) but it should be understood that the present disclosure is applicable to any type of data polynomial signal that is encoded, provided through a channel that may produce errors (e.g., residual errors) in the encoded signal and which is subsequently decoded.

Figure 1:
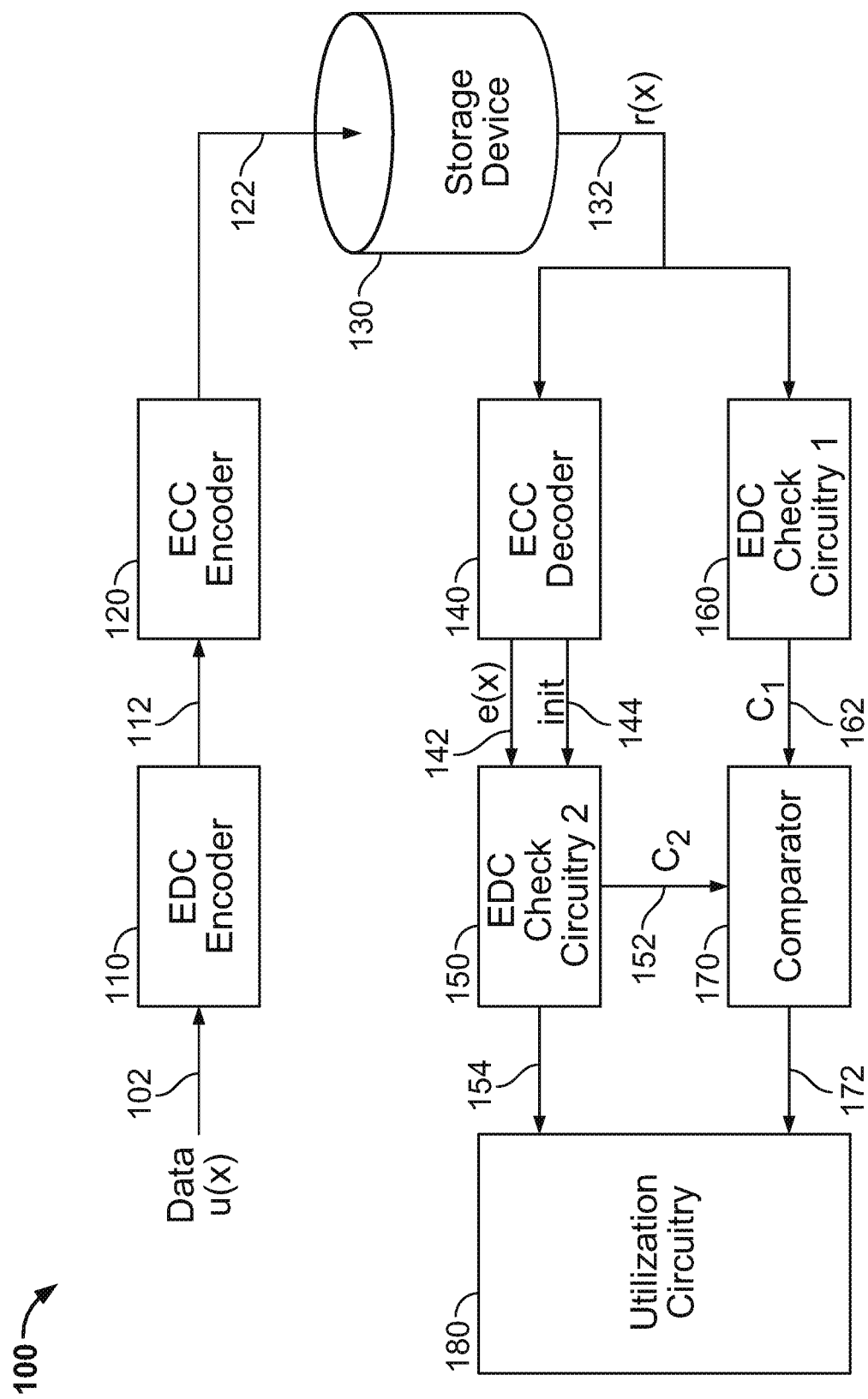
FIG. 1 shows an illustrative storage device decoding error detection system in accordance with an embodiment of the present disclosure.

FIG. 1 shows an illustrative storage device decoding error detection system 100 in accordance with an embodiment of the present disclosure. System 100 includes an error detection code encoder 110, an error correction code encoder 120, a storage device 130, an error correction code decoder 140, first and second error detection code check circuitries 150 and 160, comparator circuitry 170 and utilization circuitry 180. Although each of the components shown in FIG. 1 are drawn separately, it should be understood that each of the components may be combined into one or more analog or digital devices or silicon chips based on the application. For example, in one implementation, system 100 may be a hard disk drive in which the hard disk drive controller may include error detection code encoder 110, error correction code encoder 120, error correction code decoder 140, first and second error detection code check circuitries 150 and 160 and comparator circuitry 170 and the hard disk may be storage device 130.

Error detection code encoder 110 receives user data u(x) 102. User data u(x) 102 may be digital binary data, analog signals representing user data and/or any representation of data received from another circuit. For example, user data u(x) 102 may be provided by a signal transmission circuitry, signal receiver circuitry, processing circuitry, or directly from a user. User data u(x) 102 may be any data that is received over a channel or communications medium for storage on a storage medium.

Error detection code encoder 110 adds parity information (e.g., one or more symbols) to user data u(x) 102. In some embodiments, error detection code encoder 110 may add four parity symbols (e.g., 48 parity bits) to user data u(x) 102. Error detection code encoder 110 may add the parity information using a generator polynomial g(x). Error detection code encoder 110 provides at an output 112 the user data with the added parity information to error correction code encoder 120. In some implementations, error detection code encoder 110 may insert the parity information in a periodic, random or other suitable manner. Error detection code encoder 110 is described in more detail in connection with FIG. 2.

Error correction code encoder 120 receives the output 112 from error detection code encoder 110. Error correction code encoder 120 adds error correction parity information to the data that error correction code encoder 120 receives. The error correction parity information may be subsequently used to correct errors (e.g., residual errors) introduced by communication channel and storage mediums that follow the output of error correction code encoder 120. In some embodiments, error correction code encoder 120 may employ a 12-bit Reed Solomon (RS) error-correcting code with an error correction power of two to remove residual errors made by the channel detector. In some implementations, error correction code encoder 120 may insert the parity information in a periodic, random or other suitable manner. Any other suitable error correction code encoding scheme may be used without departing from the teachings of the present disclosure. Any other suitable combination of error correction code algorithms and error detection code algorithms may be employed in error detection code encoder 110 and error correction code encoder 120.

The output 122 of error correction code encoder 120 is provided to storage device 130. The output 122 of error correction code encoder 120 may include user data u(x) with error detection and error correction parity information added (e.g., the encoded user data). The encoding operations performed by error detection code encoder 110 and error correction code encoder 120 may be the write operation performed on storage device 130. The encoded user data may be stored for subsequent retrieval on storage device 130. In some embodiments, storage device 130 may be a magnetic storage medium or magnetic recording channel such as a hard disk drive or floppy drive or holographic storage device. In some implementations, storage device 130 may be an optical storage device such as a CD-ROM, Blu-Ray, or HD Drive. In some implementations, storage device 130 may be any MOS or CMOS storage device such as a RAM, ROM, or other suitable memory device. Storage device 130 may include any combination of magnetic, optical, holographic and silicon based storage medium.

The decoding operations discussed below in connection with error correction code decoder 140, first and second error detection code check circuitries 150 and 160 and comparator circuitry 170 may be performed during a read operation performed on storage device 130. For example, encoded user data r(x) 132 may be read from storage device 130. Encoded user data r(x) 132 may be processed through a decoding path to correct errors in the read user data and detect whether any errors in the decoding operations exist.

Encoded user data r(x) 132 may be arranged in a first order and provided through a first error detection path that includes error correction code decoder 140 and second error detection code check circuitry 150. Encoded user data r(x) 132 may be provided through a first error detection path that includes second error detection code circuitry 160. The outputs of the first and second detection paths may be compared using comparator circuitry 170 to detect inconsistencies between the data.

In the second error detection path, first error detection code check circuitry 160 may compute a first remainder 162 of encoded user data r(x) 132 that is read from storage device 130. First error detection code check circuitry 160 operates on encoded user data r(x) 132 in the first order in which encoded user data r(x) 132 is arranged. In particular, first error detection code check circuitry 160 may operate on encoded user data r(x) 132 in high-to-low order (e.g., high order symbol $r_n(x)$ comes before and is processed before lower order symbol $r_{n-1}(x)$). First error detection code check circuitry 160 is discussed in more detail in connection with FIG. 3.

In the first error detection path, error correction code decoder 140 may employ an error correction code algorithm similar to the algorithm employed by error correction code encoder 120. Error correction code decoder 140 may output an error signal e(x) 142 to second error detection code check circuitry 150. Error signal e(x) 142 may be arranged in a second order that is different than (e.g., reverse) the first order (e.g., low-to-high order) in which encoded user data r(x) 132 was read from storage device 130.

Second error detection code check circuitry 150 may compute a second remainder 152 of error signal e(x) 142 using the generator polynomial g(x). Second error detection code check circuitry 150 operates on error signal e(x) 142 in the second order that is reverse to the first order in which the data is arranged. In some embodiments, error correction code decoder 140 may provide initialization values 144 to second error detection code check circuitry 150 to initialize the algorithm and in particular the generator polynomial g(x) for each set of data read from storage device 130. Second error detection code check circuitry 150 is discussed in more detail in connection with FIGS. 5 and 6.

Comparator circuitry 170 may receive first and second remainder values 152 and 162. Comparator circuitry 170 may compute a difference between first and second remainder values 152 and 162 to detect inconsistencies between the values. In some implementations, when the computed difference is non-zero, comparator circuitry 170 may output a signal 172 indicating the presence of an error in the decoded data 154 output by second error detection code check circuitry 150.

Second error detection code check circuitry 150 may output the decoded data 154 to utilization circuitry 180. In some embodiments, second error detection code check circuitry 150 may output decoded data 154 only after receiving an indication from comparator circuitry 170 or utilization circuitry 180 that there are no decoding errors. For example, second error detection code check circuitry 150 may buffer the decoded data and receive an indication from comparator circuitry 170 that first and second remainder values 152 and 162 match. When second error detection code check circuitry 150 receives the indication from comparator circuitry 170 that first and second remainder values 152 and 162 match, second error detection code check circuitry 150 may output the buffered decoded data to utilization circuitry 180. In some embodiments, error signal e(x) 142 as decoded by second error detection code check circuitry 150 may be output continuously in real-time to utilization circuitry 180. Utilization circuitry 180 may process the data or buffer the data and may wait for an indication from comparator circuitry 170 indicating whether or not decoding errors are found in a set of data.

Utilization circuitry 180 may include various analog or digital processing circuitries. For example, utilization may be a digital signal processor or a microprocessor. In some implementations, utilization circuitry 180 may include transmitter/receiver circuitry. In some embodiments, utilization circuitry 180 may provide control signals to any one of the components of system 100 to change or modify the encoding/decoding operations.

Figure 2:
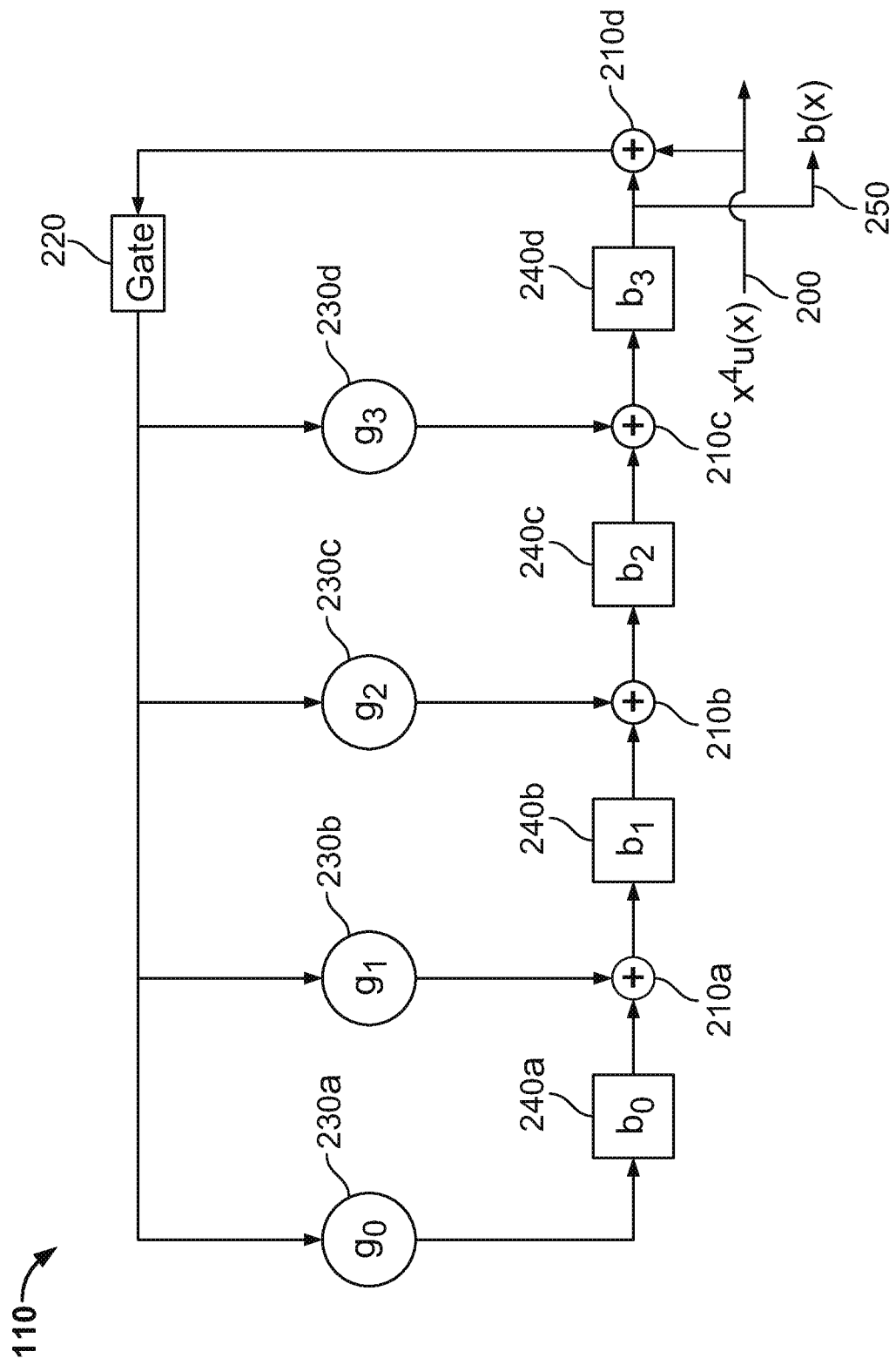
FIG. 2 shows an illustrative error detection code encoder in accordance with an embodiment of the present disclosure.

FIG. 2 shows an illustrative error detection code encoder 110 in accordance with an embodiment of the present disclosure. Error detection code encoder 110 includes constant multipliers 230a-d, four registers 240a-d, four XOR logic circuits 210a-d and gate circuitry 220. The encoding operation of encoder 110 may be controlled using gate circuitry 220. When gate circuitry 220 is turned on, user data 200 can be shifted into encoder 110. After user data 200 is shifted into encoder 110, gate circuitry 220 can be turned off and the parity data in registers 240a-b can be shifted out in the channel.

In some embodiments, error detection code encoder 110 may be implemented with the same or similar circuitry as error correction code encoder 120 (FIG. 1). For example, error detection code encoder 110 may include circuitry that implements a 12-bit Reed-Solomon Error Correction Code algorithm or any other error correction code algorithm implemented by error correction code encoder 120.

When error detection code encoder 110 implements a 12-bit Reed-Solomon Error Correction Code algorithm, register 240a-d may include 12 bits of storage (e.g., 12-bit registers) and XOR logic circuits 210a-d may be 12-bit XOR circuits. In particular, a 12-bit Reed Solomon Error Correction Code algorithm may be implemented when user data 102 includes 12 symbols. In some implementations, error detection code encoder 110 may implement a polynomial division algorithm to compute a remainder of a given polynomial. Constant multipliers 230a-d may be set to any desired constant value.

Error detection code encoder 110 iterates through each of the 12 symbols in user data 102. In particular, at each iteration, an XOR logic operation is performed on the output of register 240d and the symbol of user data 102 that is received using XOR circuitry 210d. The output of XOR circuitry 210d is provided to each of constant multipliers 230a-d. The output of constant multiplier 230a is provided to register 240a. The output of each of constant multipliers 230b-d are summed using respective XOR circuitries 210a-c with outputs of respective registers 240a-c.

Error detection code encoder 110 computes the remainder $b(x)$ of $x^4 u(x)$ over a function $g(x)$, where $u(x)$ is a function that represents user data 102 (FIG. 1) and the polynomial function:

$$g(x)=g_0+g_1 x+g_2 x^2+g_3 x^3+x^4.\qquad\text{Equation (1):}$$

Error detection code encoder 110 forms a codeword polynomial:

$$U(x)=b(x)+x^4 u(x).\qquad\text{Equation (2):}$$

Constant multipliers 230a-d may store respective values corresponding to $g_1$, $g_2$, $g_3$ and $g_4$. After iterating through the 12 symbols in user data 102, registers 240a-d, store the remainder $b(x)$.

For example, error detection code encoder 110 may append four error detection parity symbols (e.g., 48 bits) to user data 102. After error detection code encoder 110 appends the parity information, error correction code encoder 120 inserts error correction parity information to the encoded data. For example, error correction code encoder 120 may insert error correction parity symbols in a period manner after every four user data symbols (e.g., after 48 bits of user data). This process may cause the error detection parity symbols to be separated by the period selected (e.g., error detection parity symbols may be separated by four user data symbols). In particular, in some embodiments, error correction code encoder 120 may insert error correction parity information after every four symbols and may utilize the error detection parity information to avoid adding redundant symbols. For example, because four adjacent error detection parity symbols are appended to user data 102, error correction code encoder 120 may separate the four adjacent error detection parity symbols within user data 102 and use them as error correction parity symbols. More specifically, error correction code encoder 120 may position one of the error detection parity symbols between every four user symbols starting from the end of user data 102.

Figure 3:
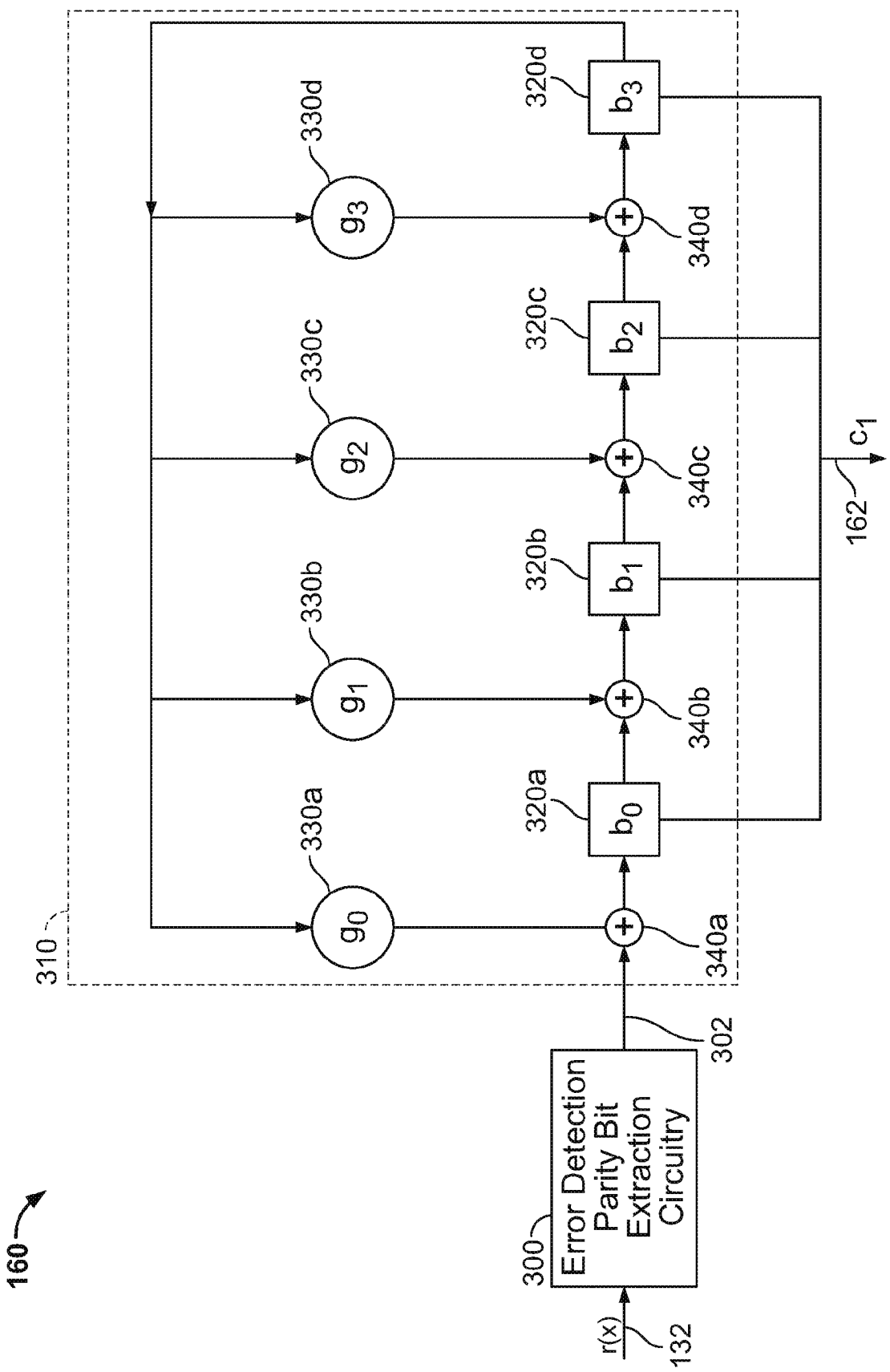
FIG. 3 shows an illustrative first error detection code check circuitry in accordance with an embodiment of the present disclosure.

After the encoded data is read from storage device 130 (FIG. 1), encoded user data $r(x)$ 132 is provided to first error detection code check circuitry 160. FIG. 3 shows an illustrative first error detection code check circuitry 160 in accordance with an embodiment of the present disclosure. First error detection code check circuitry 160 includes an error detection parity bit extraction circuitry 300 and division circuitry 310. First error detection code check circuitry 160 may compute the remainder of the received data polynomial (e.g., encoded user data $r(x)$ 132) over the generator polynomial $g(x)$. First error detection code circuitry 160 may operate to remove the error correction parity information and restore the error detection parity information encoded into user data 102.

Error detection parity bit extraction circuitry 300 may receive encoded user data $r(x)$ 132 and may remove from the encoded user data the detection parity information added by error detection code encoder 110 (FIG. 1). Error detection parity bit extraction circuitry 300 may store the extracted error detection parity information and may subsequently add the parity information back in after division circuitry 310 iterates through the encoded user data.

Figure 4:
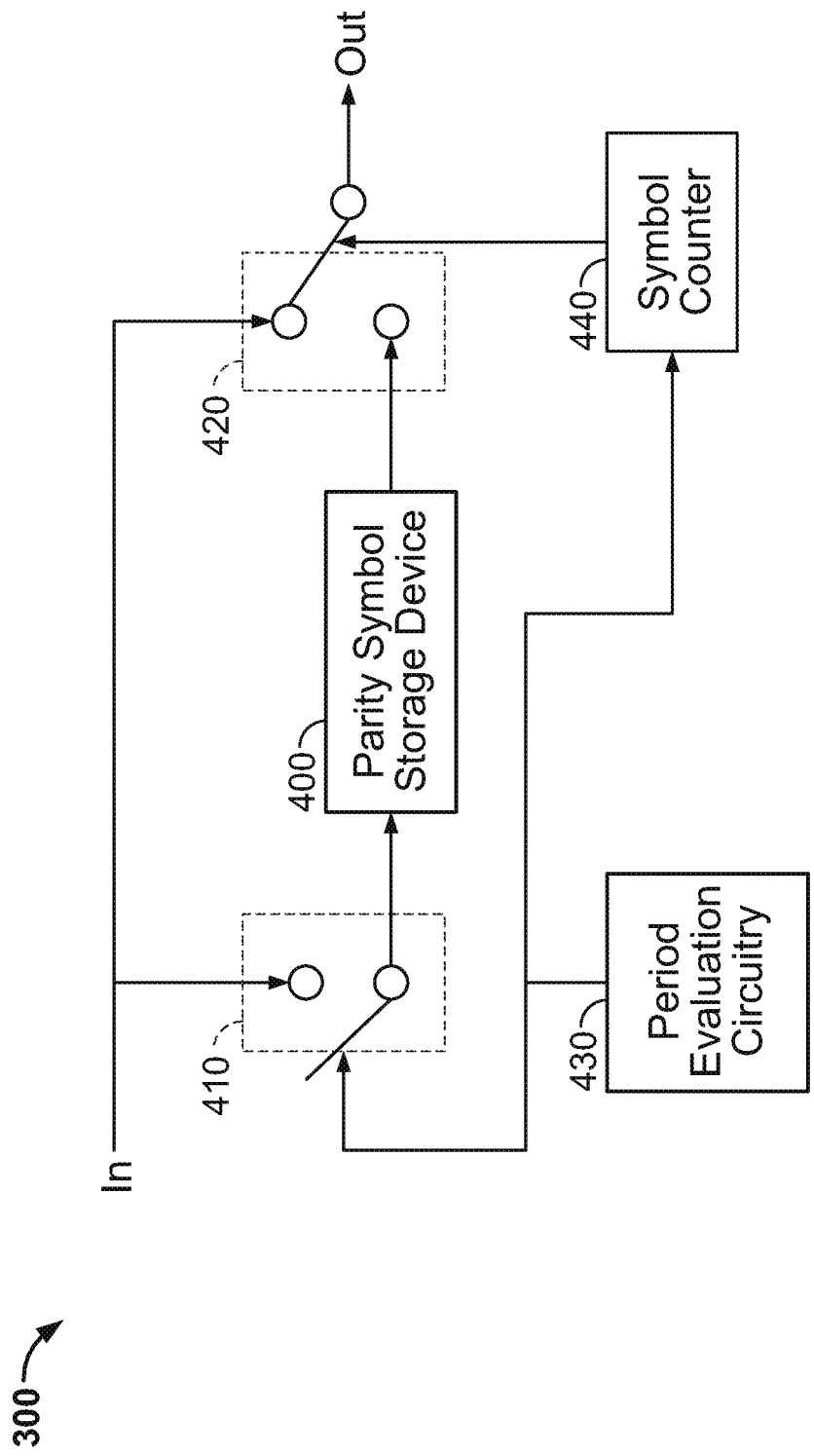
FIG. 4 shows an illustrative error detection parity bit extraction circuitry in accordance with an embodiment of the present disclosure.

FIG. 4 shows one implementation of error detection parity bit extraction circuitry 300. Error detection parity bit extraction circuitry 300 may include a first switch 410, a second switch 420, a parity symbol storage device 400, period evaluation circuitry 430 and a symbol counter 440. Period evaluation circuitry 430 may be configured with the period or frequency at which parity information is encoded by error correction code encoder 120. In some implementations, period evaluation circuitry 430 may be trained to determine a certain period or frequency at which parity information is encoded by information stored in a header of the data stored in storage device 130. For example, period evaluation circuitry 430 may read a header of encoded user data 132 and based on information stored in the header, determine the period or frequency at which the parity information is encoded.

Period evaluation circuitry 430 may control switch 410 based on the period or frequency at which the parity information is inserted into user data 132. For example, when the parity information is inserted after every four user data symbols, period evaluation circuitry 430 may toggle switch 410 after every four symbols to provide the parity information to parity symbol storage device 400. Symbol storage device 400 may be a memory or shift register capable of storing at least the same number of error detection symbols inserted by error detection code encoder 110 (e.g., four symbols or 48 bits). In particular, the error detection parity symbols may be periodically dropped into symbol storage device 400 in a first in first out basis such that the first symbol that is dropped into symbol storage device 400 is the first symbol that is read out of symbol storage device 400 by switch 420. In some embodiments, division circuitry 310 may be paused when an error detection symbol is being stored into parity symbol storage device 400 to allow division circuitry 310 to wait for the next valid user data symbol.

Symbol counter 440 may receive input from period evaluation circuitry 430 and may count the number of user data symbols and/or parity symbols that are being stored or provided to division circuitry 310. In particular, symbol counter 440 may determine based on a count value when the last user data symbol is provided to division circuitry 310. For example, symbol counter 440 may be configured or may determine based on header information of user data 132 how many user data symbols are present in encoded user data 132. When symbol counter 440 reaches the number of user data symbols present in user data 132, symbol counter 440 may control switch 420 to output the parity symbols stored in storage device 400 on a first in first out basis. In some implementations, the parity symbols initially stored in parity symbol storage device 400 may be the error correction parity symbols. In such circumstances, symbol counter 440 may allow the error correction parity symbols to pass through for processing by division circuitry 310. In particular, only the error detection parity symbols (e.g., the last four symbols stored in storage device 400) participate in error detection correction operations and not the error correction parity symbols.

Division circuitry 310 operates in a similar manner as circuit 110 discussed in connection with FIG. 2. In particular, division circuitry 310 may include constant multipliers 330a-d, registers 320a-d and XOR circuitries 340a-d. Constant multipliers 330a-d may be configured to provide constant multiplication equal to the constant multiplication provided by constant multipliers 230a-d. Registers 320a-d may have the same or similar functionality as registers 240a-d and XOR circuitries 340a-d may have the same or similar functionality as XOR logic circuitries 210a-d. After division circuitry 310 iterates through all the symbols (user data and parity information) in user data 132 (e.g., after division circuitry 310 computes the remainder of the received data polynomial r(x) 132 over the generator polynomial g(x)), registers 320a-d may each store portions of the remainder of the received data polynomial. In particular, first remainder 162 may be provided by each of registers 320a-d. As discussed above, first remainder 162 may be compared with second remainder 152 to determine and detect decoding errors.

Figure 5:
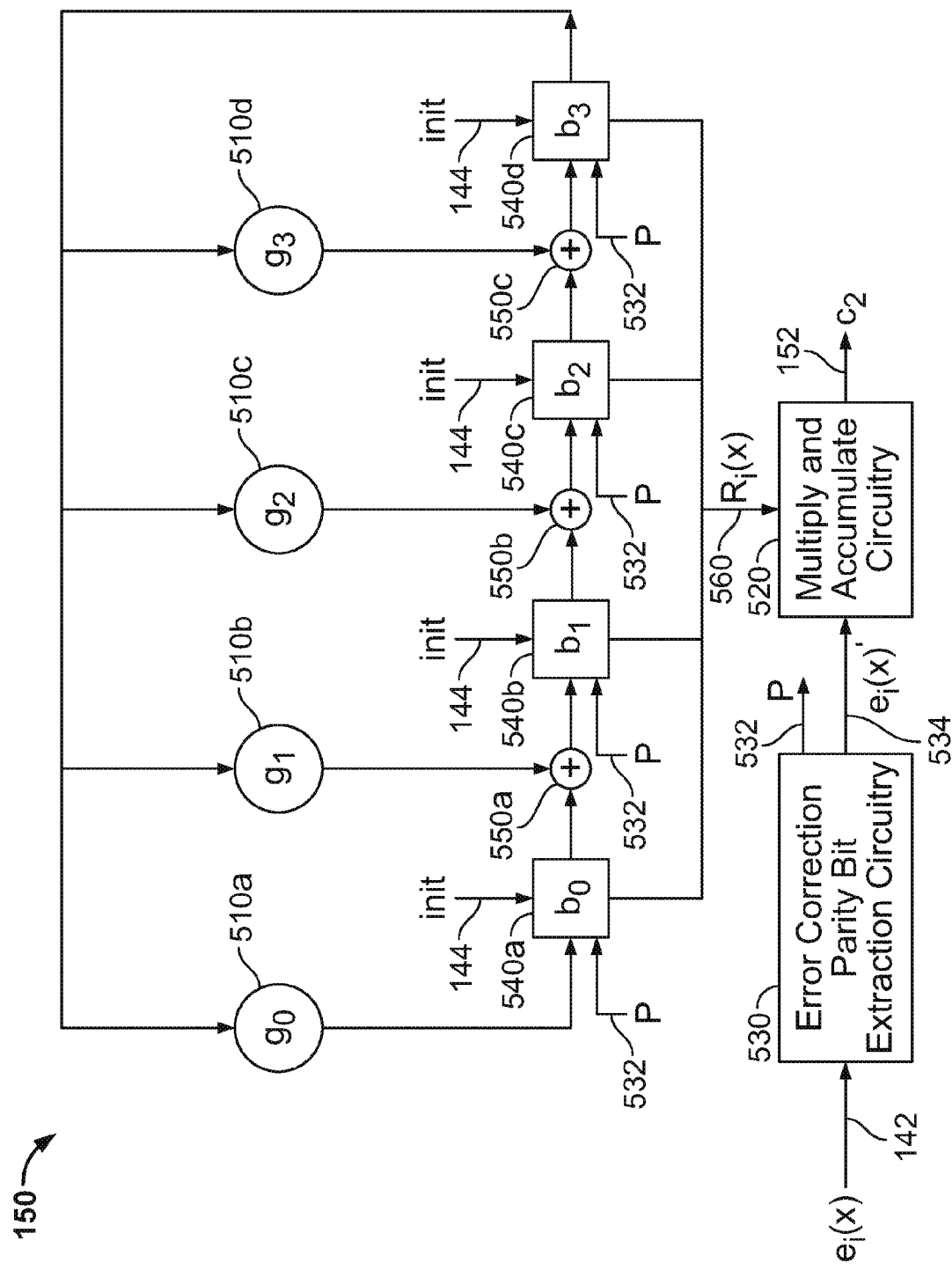
FIG. 5 shows another illustrative second error detection code check circuitry in accordance with an embodiment of the present disclosure.

As discussed above, second error detection code check circuitry 150 receives error signal e(x) 142 (which is arranged in the second order reverse to the first order where in the second order the data is arranged in low-to-high order) from error correction code decoder 140 and computes second remainder 152 based on a division operation of the polynomial of error signal e(x) 142. In particular, second error detection code check circuitry 150 may calculate the remainder of error pattern polynomial e(x) 142 over the generator polynomial g(x). Second error detection code check circuitry 150 may provide second remainder 152 to comparator 170 to determine and detect decoding errors. Second error detection code check circuitry 150. FIG. 5 shows another illustrative second error detection code check circuitry 150 in accordance with an embodiment of the present disclosure. Second error detection code check circuitry 150 includes error correction parity bit extraction circuitry 530, multiply and accumulate circuitry 520, constant multipliers 510a-d, XOR circuitries 550a-c and registers 540a-d.

Second error detection code check circuitry 150 is different from first error detection code check circuitry 160 in that second error detection code check circuitry 150 operates on data received in a reverse order from which the data is read from storage device 130. More specifically, second error detection code check circuitry 150 may operate on data received in low-to-high order while first error detection code check circuitry 160 may operate on data received in high-to-low order. Second error detection code check circuitry 150 computes second remainder 152 in accordance with:

$$b_e(x) = e(x) \bmod g(x);$$ Equation (3):

where $b_e(x)$ is second remainder 152, e(x) is error signal e(x) 142 received from error correction code decoder 140 and g(x) is the polynomial used by error detection and error correction code encoders 110 and 120 to insert the parity information. More specifically, g(x) is the polynomial having coefficient values equal to the coefficient values of constant multipliers 230a-d and 330a-d (FIGS. 2 and 3). Equation 3 may be simplified based on the linear property of polynomial modular operations as follows:

$$b_e(x) = \sum_{i=0}^{n-1} e_i R_i(x);$$ Equation (4)

$$R_i(x) = x^i \bmod g(x);$$ Equation (5):

where n is an integer, i is a symbol index, e is error signal e(x) 142 received from error correction code decoder 140 and g(x) is the polynomial used by error detection and error correction code encoders 110 and 120 to insert the parity information. Second error detection code check circuitry 150 may implement Equations 4 and 5 to compute second remainder 152.

In some implementations, constant multipliers 510a-d may be initialized with the same values as constant multipliers 230a-d or 330a-d (FIGS. 2 and 3). Registers 540a-d may be initialized based on init values 144 received from error correction decoder 140 to generate $R_i(x)$ 560 of Equation 5. Init values 144 may be a vector of values where each index in the vector includes 12-bits to be stored in a respective one of register 540a-d. In particular, init values 144 may be the vector [1, 0, 0, 0] which causes a value of all ones '1' to be stored to register 540a and all zeros '0' to be stored in registers 540b-d. In this circuitry, after each shift operation, the remainder of polynomial division $x \cdot (b_0 + b_1 x + b_2 x^2 + b_3 x^3)$ mod g(x) are stored in registers 540a-d. Initially, $R_0(x)=1$ mod g(x), hence $b_0=1$. Then in the next step, $R_1(x)=x$ mod g(x), can be obtained.

Constant multipliers 510a-d, registers 540a-d and XOR circuitries 550a-c may iterate after initialization to consecutively generate the sequence of $R_i(x)$ 560 and in particular $R_0(x), R_1(x), R_2(x) \ldots$ and $R_{n-1}(x)$, where n is the number of symbols in error signal e(x) 142. Error correction parity bit extraction circuitry 530 may extract error correction and/or error detection parity information from error signal e(x) 142. Error correction parity bit extraction circuitry 530 may generate error signal $e_i(x)'$ 534 which may be error signal e(x) 142 with the error correction and/or error detection parity information removed or extract. Error correction parity bit extraction circuitry 530 may provide error signal $e_i(x)'$ 534 to multiply and accumulate circuitry 520 for use in computing second remainder 152 in accordance with Equation 4. Error correction parity bit extraction circuitry 530 may be implemented in the same or similar manner as error detection parity bit extraction circuitry 300 (FIG. 4).

For example, error correction parity bit extraction circuitry 530 may determine the period of parity information insertion using period evaluation circuitry 430 (FIG. 4) and may provide a pause signal 532 to registers 540$a$-$d$ when the current symbol of error signal e(x) 142 that is received is an error correction or error detection parity symbol. Registers 540$a$-$d$ may not latch or register any values (e.g., registers 540$a$-$d$ may pause their operations) when pause signal 532 is asserted indicating that an error correction or error detection parity symbol is currently being received. Registers 540$a$-$d$ may continue their operations once pause signal 532 is de-asserted.

Figure 6:
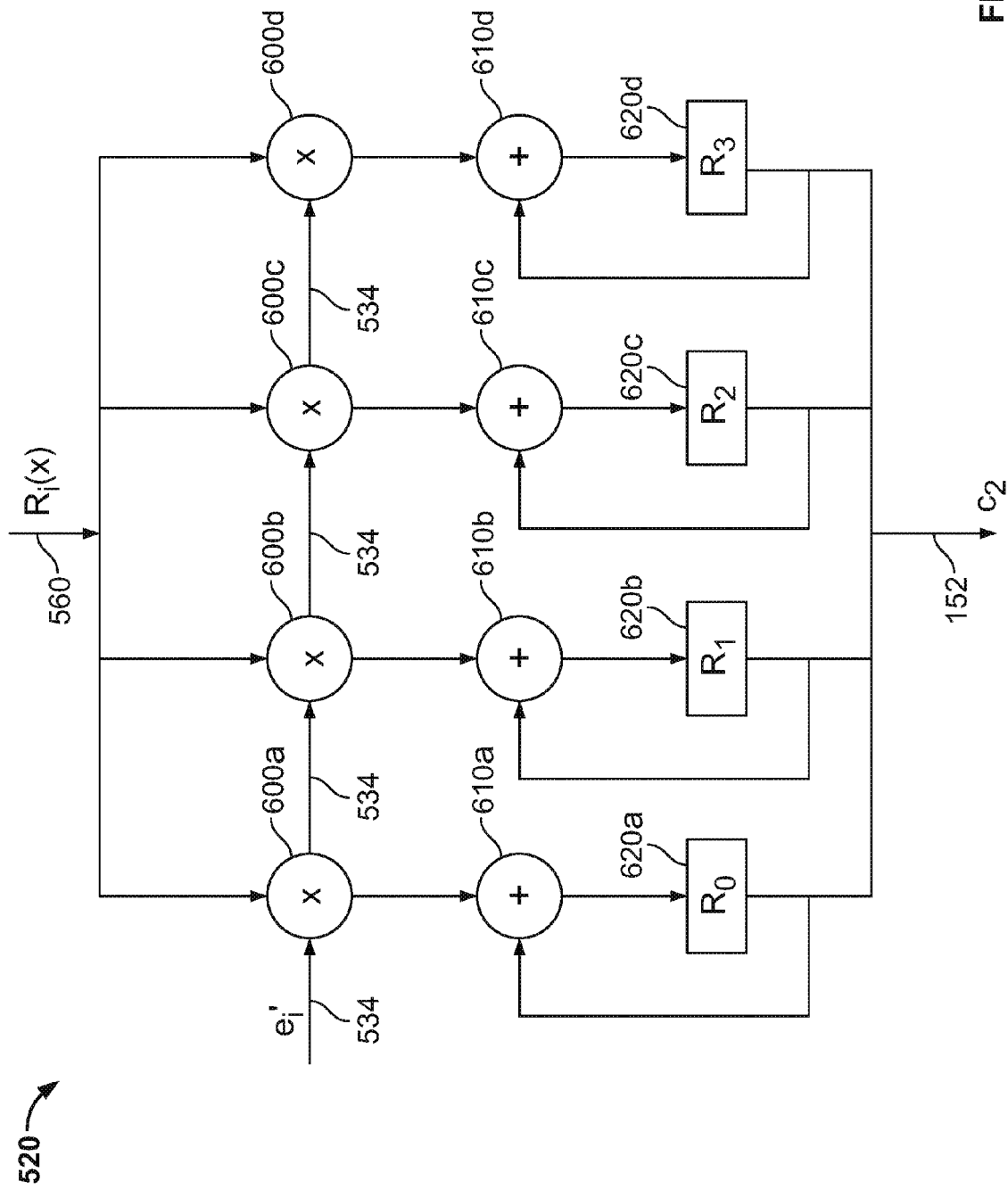
FIG. 6 shows an illustrative error polynomial multiply and accumulate circuitry in accordance with an embodiment of the present disclosure.

The sequence of $R_i(x)$ 560 may be provided to multiply and accumulate circuitry 520 to compute second remainder 152 in accordance with Equation 4. In particular, second remainder 152 may be computed by summing or accumulating all the terms of $e_i R_i(x)$. FIG. 6 shows an illustrative error polynomial multiply and accumulate circuitry 520 in accordance with an embodiment of the present disclosure. Error polynomial multiply and accumulate circuitry 520 may include multiplier circuits 600$a$-$d$, adder circuitry 610$a$-$d$ and registers 620$a$-$d$. Accordingly, second remainder 152 may be computed without using two codeword buffers to reverse the order of the data provided by error correction decoder 140. The number of registers 540$a$-$d$, constant multipliers 510$a$-$d$, multiplier circuits 600$a$-$d$, adder circuits 610$a$-$d$ and registers 620$a$-$d$ may correspond to the number of components in the generator polynomial g(x). In the above and below discussed implementation, g(x) includes four components since the greatest power in the generator polynomial g(x) is $x^4$ as shown in Equation 1 above.

For example, in some embodiments, instead of computing second remainder 152 using circuitry 150, second remainder 152 may be computed using the same or similar circuitry as circuitry 160 (FIG. 3) but with the addition of one or two buffers large enough to store all the symbols retrieved from storage device 130. More specifically, the one or two buffers may be used to reverse the order of the data provided by error correction code decoder 140 into the same order as the data 132 read from storage device 130. In embodiments which use circuitry 150 to compute second remainder 152, the data need not be reversed and thus the use of the one or two buffers to reverse the order of the data before processing the data with error detection code check circuitry may be avoided.

Multiply and accumulate circuitry 520 may receive and multiply $R_i(x)$ 560 with error signal $e_i(x)'$ 534 using multipliers 600$a$-$d$. The output of multipliers 600$a$-$d$ is provided to respective adder circuitry 610$a$-$d$ for accumulation with a prior computed multiplication. More specifically, with each iteration of circuitry 520, $R_i(x)$ 560 with error signal $e_i(x)'$ 534 multiplication corresponding to the current symbol of the data is accumulated with $R_i(x)$ 560 with error signal $e_i(x)'$ 534 multiplication corresponding to the previous symbol which is stored in registers 620$a$-$d$. Each register 620$a$-$d$ corresponds to a different component of the generator polynomial g(x) and thereby a different component of $R_i(x)$ 560 and error signal $e_i(x)'$ 534. After circuitry 520 iterates through all the symbols of error signal $e_i(x)'$ 534, second remainder 152 is stored and provided by registers 620$a$-$d$.

Figure 7:
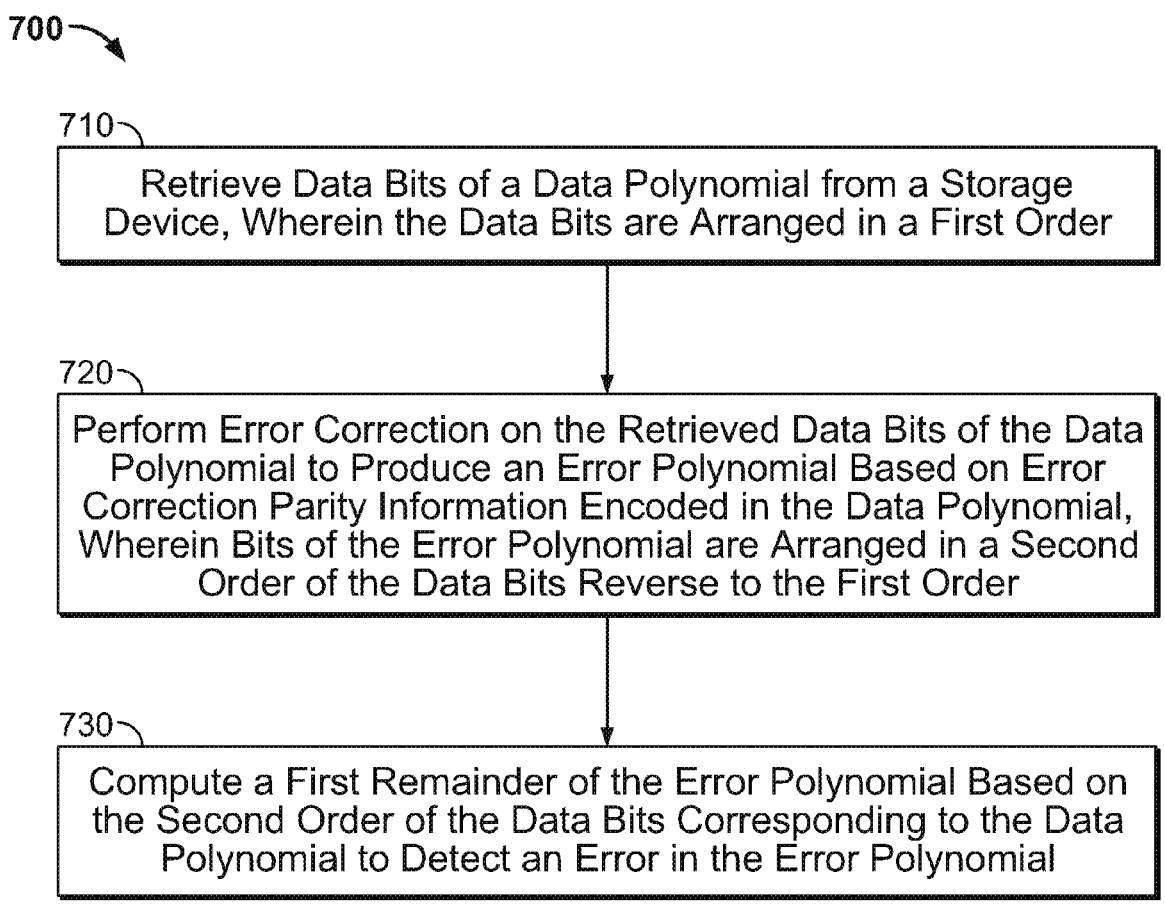
FIG. 7 is an illustrative flow diagram for performing decoding error detection in a storage device in accordance with embodiments of the present disclosure.

FIG. 7 is an illustrative flow diagram 700 for performing decoding error detection in a storage device in accordance with embodiments of the present disclosure. At 710, data bits, arranged in a first order, of a data polynomial are retrieved from a storage device. For example, encoded user data r(x) 132 may be read from storage device 130 (FIG. 1). The data bits or symbols of encoded user data r(x) 132 may be arranged in a high-to-low order (e.g., high order symbol $r_n(x)$ comes before lower order symbol $r_{n-1}(x)$).

At 720, error correction is performed on the retrieved data bits of the data polynomial to produce an error polynomial based on error correction parity information encoded in the data polynomial. Bits of the error polynomial are arranged in a second order of the data bits reverse to the first order. For example, error correction decoder circuitry 140 performs error correction using a 12-bit Reed Solomon Error Correction Code algorithm to produce error signal e(x) 142 (FIG. 1). Bits or symbols of error signal e(x) 142 may be arranged in an order reverse to the bits or symbols of encoded user data r(x) 132 (e.g., low-to-high order).

At 730, a first remainder of the error polynomial is computed based on the second order of the data bits corresponding to the data polynomial to detect an error in the error polynomial. For example, second error detection code check circuitry 150 computes second remainder 152 in accordance with Equation 4. Second remainder 152 may be compared with a first remainder 160 produced by first error check circuitry 160 to determine and detect a decoding error.

The above described embodiments of the present disclosure are presented for purposes of illustration and not of limitation, and the present disclosure is limited only by the claims which follow.

What is claimed is:

1. A method for performing error detection in a storage device, the method comprising:
   retrieving data bits of a data polynomial from the storage device, wherein the retrieved data bits of the data polynomial are arranged in a first order;
   performing error correction on the retrieved data bits of the data polynomial to produce a first error polynomial based on error correction parity information encoded in the data polynomial, wherein bits of the first error polynomial are arranged in a second order that is reverse to the first order; and
   computing a remainder of the first error polynomial to detect an error in the first error polynomial based on the data bits of the first error polynomial arranged in the second order, wherein computing the remainder comprises:
   calculating a reference polynomial based on a generator polynomial and a set of initialization values; and
   multiplying and accumulating the reference polynomial with a second error polynomial to provide the remainder, wherein the second error polynomial is generated by removing parity information from the first error polynomial.

2. The method of claim 1, wherein:
   the data polynomial is generated based on the generator polynomial.

3. The method of claim 1 further comprising removing the error correction parity information prior to the multiplying and accumulating.

4. The method of claim 1, wherein the computing the remainder comprises computing a modulus operation of the first error polynomial with the generator polynomial.

5. The method of claim 1 further comprising:
   computing a remainder of the data polynomial based on the data bits of the data polynomial arranged in the first order; and
   comparing the remainder of the first error polynomial with the remainder of the data polynomial to detect an error in the first error polynomial.

6. The method of claim 1, wherein
the storage device comprises magnetic storage medium.

7. The method of claim 1, wherein
the error correction parity information is periodically positioned within the data polynomial.

8. A system for performing error detection in a storage device, the system comprising:
control circuitry configured to retrieve data bits of a data polynomial from the storage device, wherein the retrieved data bits of the data polynomial are arranged in a first order;
error correction circuitry configured to perform error correction on the retrieved data bits of the data polynomial and produce a first error polynomial based on error correction parity information encoded in the data polynomial, wherein bits of the first error polynomial are arranged in a second order that is reverse to the first order; and
first error detection code check circuitry configured to compute a remainder of the first error polynomial to detect an error in the first error polynomial based on the data bits of the first error polynomial arranged in the second order, wherein the first error detection code check circuitry comprises:
polynomial generation circuitry configured to calculate a reference polynomial based on a generator polynomial and a set of initialization values; and
summation circuitry configured to multiply and accumulate the reference polynomial with a second error polynomial to provide the remainder, wherein the second error polynomial is generated by removing parity information from the first error polynomial.

9. The system of claim 8, wherein:
the data polynomial is generated based on the generator polynomial.

10. The system of claim 8, wherein the polynomial generation circuitry comprises:
first and second constant multipliers;
an XOR circuit; and
first and second registers; wherein:
an output of the second register is provided to inputs of the first and second constant multipliers;
an output of the first constant multiplier is provided to the first register;
an output of the second constant multiplier is provided to a first input of the XOR circuit;
an output of the first register is provided to a second input of the XOR circuit; and
an output of the XOR circuit is provided to an input of the second register.

11. The system of claim 10 further comprising a plurality of XOR circuits coupled to a plurality of registers between the first register and the second register, wherein the plurality of XOR circuits are configured to provide the output of the first register to the second register.

12. The system of claim 11, wherein the summation circuitry comprises:
a plurality of accumulation circuitries;
a plurality of multipliers each configured to:
receive a respective output of the plurality of registers including the first and second registers; and
receive the first error polynomial;
wherein an output of each of the plurality of multipliers is provided to a respective one of the accumulation circuitries.

13. The system of claim 8, wherein the remainder of the first error polynomial is computed in accordance with:

$$b(x) = e(x) \bmod g(x)$$

where $b(x)$ is the remainder of the first error polynomial, $e(x)$ is the first error polynomial and $g(x)$ is the generator polynomial used to generate the data polynomial.

14. The system of claim 8 further comprising:
second error detection code check circuitry configured to compute a remainder of the data polynomial based on the data bits of the data polynomial arranged in the first order; and
comparison circuitry configured to compare the remainder of the first error polynomial with the remainder of the data polynomial to detect an error in the first error polynomial.

15. The system of claim 8, wherein the storage device comprises magnetic storage medium.

16. The system of claim 8, wherein the error correction parity information is periodically positioned within the data polynomial.

17. The system of claim 8, wherein the control circuitry, the error correction circuitry, and the first error detection code check circuitry is comprised in a magnetic storage device.

18. The system of claim 8, wherein the control circuitry, the error correction circuitry, and the first error detection code check circuitry is comprised in a semiconductor chip.

19. The system of claim 8, wherein the first error detection code check circuitry is further configured to remove the error correction parity information prior to the multiplying and accumulating.

20. The system of claim 8, wherein the first error detection code check circuitry is further configured to compute a modulus operation of the first error polynomial with the generator polynomial.

* * * * *